US008952376B2

(12) United States Patent
Lee et al.

(10) Patent No.: US 8,952,376 B2
(45) Date of Patent: Feb. 10, 2015

(54) THIN FILM TRANSISTOR, AND METHOD OF MANUFACTURING THE SAME

(75) Inventors: Je-Hun Lee, Seoul (KR); Joo-Han Kim, Yongin-si (KR)

(73) Assignee: Samsung Display Co., Ltd., Yongin (KR)

(*) Notice: Subject to any disclaimer, the term of this patent is extended or adjusted under 35 U.S.C. 154(b) by 58 days.

(21) Appl. No.: 13/049,547

(22) Filed: Mar. 16, 2011

(65) Prior Publication Data

US 2011/0240987 A1    Oct. 6, 2011

(30) Foreign Application Priority Data

Apr. 6, 2010   (KR) .................. 10-2010-0031415

(51) Int. Cl.
| | | |
|---|---|---|
| *H01L 29/10* | (2006.01) | |
| *H01L 29/12* | (2006.01) | |
| *H01L 31/00* | (2006.01) | |
| *H01L 29/786* | (2006.01) | |
| *H01L 27/12* | (2006.01) | |

(52) U.S. Cl.
CPC ...... *H01L 29/7869* (2013.01); *H01L 29/78648* (2013.01); *H01L 29/78696* (2013.01); *H01L 27/1225* (2013.01)
USPC ............................................. 257/43; 257/57

(58) Field of Classification Search
USPC ............. 257/43, E21.411, E29.296, 57
See application file for complete search history.

(56) References Cited

U.S. PATENT DOCUMENTS

| | | | | |
|---|---|---|---|---|
| 5,834,797 A | * | 11/1998 | Yamanaka | 257/57 |
| 6,380,007 B1 | * | 4/2002 | Koyama | 438/151 |
| 2004/0224448 A1 | * | 11/2004 | Tanabe | 438/166 |
| 2007/0187760 A1 | * | 8/2007 | Furuta et al. | 257/347 |
| 2008/0318368 A1 | * | 12/2008 | Ryu et al. | 438/151 |
| 2009/0134390 A1 | * | 5/2009 | Kodama et al. | 257/43 |
| 2009/0236596 A1 | * | 9/2009 | Itai | 257/43 |
| 2010/0032665 A1 | * | 2/2010 | Yamazaki et al. | 257/43 |
| 2010/0163863 A1 | * | 7/2010 | Yaegashi | 257/43 |

* cited by examiner

*Primary Examiner* — Khiem D Nguyen
*Assistant Examiner* — Wilner Jean Baptiste
(74) *Attorney, Agent, or Firm* — H.C. Park & Associates, PLC

(57) ABSTRACT

A thin film transistor and a method of manufacturing the same are provided. The thin film transistor includes a first gate electrode and an active layer including a crystalline oxide semiconductor which is insulated from the first gate electrode by a first insulating layer and the active layer is arranged to overlap the first gate electrode. A source electrode is formed including at least a portion overlaps the active layer, and a drain electrode is arranged being spaced apart from the source electrode and at least a portion of the drain electrode overlaps the active layer, wherein the source electrode and the drain electrode are insulated from the first gate electrode by the first insulating layer.

12 Claims, 6 Drawing Sheets

THIN FILM TRANSISTOR, AND METHOD OF MANUFACTURING THE SAME

CROSS-REFERENCE TO RELATED APPLICATION

This application claims priority to and benefit of Korean Patent Application No. 10-2010-0031415, filed on Apr. 6, 2010, which is herein incorporated by reference for all purposes as if fully set forth herein.

BACKGROUND OF THE INVENTION

1. Field of the Invention

Exemplary embodiments of the present invention relates to a thin film transistor and a method of manufacturing a thin film transistor using an oxide semiconductor as an active layer.

2. Description of the Related Art

A liquid crystal display has been adopted as one of the most widely used displays. Typically, a liquid crystal display may include a display panel composed of two substrates, on which electrodes may be formed, and a liquid crystal layer may be interposed between the two substrates to display an image.

A plurality of pixel electrodes may be arranged in the form of a matrix on a first substrate of the two substrates, and a common electrode may be disposed on the whole surface of a second substrate of the two substrates. As voltages are separately applied to the respective pixel electrodes, an image is displayed on the display panel. To control a separate voltage applied to each pixel electrodes, thin film transistors may be connected to the respective pixel electrodes as elements for switching the voltages, and a plurality of interconnections including gate lines may be disposed to transfer signals for controlling the thin film transistors and data lines may be disposed to transfer the voltages to be applied to the pixel electrodes. In this example, the thin film transistor that is used as the switching element may include a gate electrode, source/drain electrodes, and an active layer, and when a predetermined voltage is s applied to the gate electrode, the active layer may be turned on to make current flow between the source electrode and the drain electrode.

On the other hand, since the liquid crystal display is a non-radiative device which has no self-luminous capability, a backlight unit for supplying light to the display panel should be provided. However, such light from the backlight unit is an important factor which acts as thermal stresses on the thin film transistors that render instabilities of the thin film transistors formed on the first substrate of the display panel by changing the characteristics of the thin film transistors.

Therefore, there is a need for an approach to provide a thin film transistor which has a structure capable of stably securing the characteristics of thin film transistors having a tolerance of the thermal influence of light even if the thin film transistors are irradiated with the light.

SUMMARY OF THE INVENTION

Exemplary embodiments of the present invention relate to a thin film transistor having a thermal tolerance from light and a method of manufacturing a thin film transistor using an oxide semiconductor as an active layer.

Additional features of the invention will be set forth in the description which follows, and in part will be apparent from the description, or may be learned by practice of the invention.

Exemplary embodiments of the present invention provide a thin film transistor. The thin film transistor includes a first gate electrode. The thin film transistor also includes an active layer including a crystalline oxide semiconductor being insulated from the first gate electrode by a first insulating layer, and the active layer is arranged to overlap the first gate electrode. The source electrode and the drain electrode are insulated from the first gate electrode by the first insulating layer. And at least a portion of the source electrode overlaps with the active layer, and at least a portion of the drain electrode overlaps with the active layer.

Exemplary embodiments of the present invention provide a method of manufacturing a thin film transistor. The method includes forming a first gate electrode. The method also includes forming an active layer comprising crystalline oxide semiconductor being insulated from the first gate electrode by a first insulating layer. The active layer is arranged to overlap the first gate electrode. The method also includes forming a source electrode and a drain electrode which is spaced apart from the source electrode. The source electrode and the drain electrode are insulated from the first gate electrode by the first insulating layer. And at least a portion of the source electrode overlaps with the active layer, and at least a portion of the drain electrode overlaps with the active layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
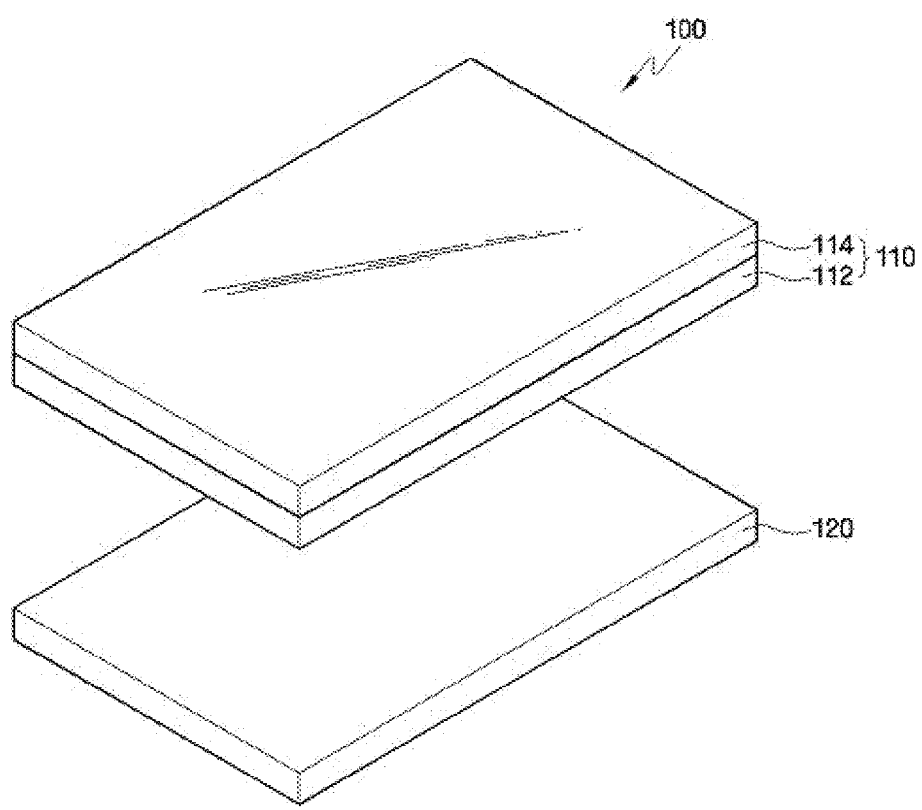
FIG. 1 is a diagram showing a liquid crystal display according to exemplary embodiments of the present invention.

Advantages and features of the present invention can be understood more readily by reference to the following detailed description of exemplary embodiments and the accompanying drawings. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art.

It is understood that when an element or layer is referred to as being "on," "connected to," or "coupled to" another element or a different layer, it can be directly on, connected or coupled to the other element or layer or intervening elements or layers may be present. In contrast, when an element is referred to as being "directly on," "directly connected to," or "directly coupled to" another element or layer that means that an element is directly on another element or a layer without intervention of any other element or layer. Also, the term "and/or" includes any and all combinations of one or more of the described items.

Spatially relative wordings such as "below," "beneath," "lower," "above," "upper," and so forth, as illustrated in the drawings, may be used for illustration of elements or spatial relationship with respect to an element or constituent elements and another element or other constituent elements. The spatially relative wordings may be understood as wordings that include different directions of the element in use or operation in addition to the direction illustrated in the drawings. In the entire description of the present invention, the same drawing reference numerals may be used for the same elements across various figures.

In the following description of the present invention, embodiments of the present invention may be described with reference to schematic views, for example, plane views and sectional views for better understanding of the invention. The form of exemplary views may be modified due to the manufacturing techniques and/or by way of manufacturing configurations. Accordingly, exemplary embodiments of the present invention may not be limited to their specified form as illustrated, but may include changes according to manufacturing processes by way of manufacturing optimizations and configurations. Accordingly, areas seen in the drawings may have exemplary properties, and the shapes of areas in the drawings may be exemplary forms of areas of elements, thus these shapes of the areas seen in the drawings may not limit the scope of the present invention.

FIG. 1 is a diagram showing a liquid crystal display according to exemplary embodiments of the present invention.

Referring to FIG. 1, as an example, a liquid crystal display 100 includes a display panel 110 to display an image, and a backlight unit 120 to provide light to the display panel 110.

Specifically, the display panel 110 includes a lower substrate 112 on which thin film transistors, pixel electrodes are formed, an upper substrate 114 which is opposite to the lower substrate 112 and color filters and a common electrode are formed on the upper substrate 114, and a liquid crystal layer (not illustrated) may be interposed between the lower substrate 112 and the upper substrate 114. By driving the liquid crystal layer through applying of predetermined voltages to the pixel electrodes formed on the lower substrate 112 and the common electrode formed on the upper substrate 114, an image may be displayed through the display panel 110. Since the lower substrate 112 includes thin film transistors, it is also referred to a thin film transistor substrate. The detailed structure thereof will be more fully described later with reference to FIG. 2 and FIG. 7, FIG. 8 and FIG. 9.

The backlight unit 120 is positioned on the lower part of the display panel 110, and is provided with a plurality of light sources (not illustrated) to provide light generated from the light sources to the display panel 110. In this example, as the light sources of the backlight unit 120, LEDS (Light Emitting Diodes) may be used.

Particularly, the light provided from the backlight unit 120 to the display panel 110 may be an important factor because thermal effect of the backlight unit 120 changes the electric characteristics of the thin film transistors formed on the lower substrate 112. According to exemplary embodiments of the present invention, it is contemplated to stably secure the electric characteristics of the thin film transistors by providing a thermal effect tolerance thin film transistor structure that can reduce the influence of the light. The structure and characteristics of such a thin film transistor will be more fully described later with reference to FIG. 2, FIG. 3, FIG. 4, FIG. 5, FIG. 6, FIG. 7, FIG. 8 and FIG. 9.

Although not illustrated in the drawing, a plurality of optical sheets for controlling light provided from the backlight unit 120 may be arranged between the display panel 110 and the backlight unit 120, and a frame for fixing or accommodating the display panel 110 or the backlight unit 120 may further be provided by way of configurations.

Hereinafter, with reference to the accompanying drawings, exemplary embodiments of the thin film transistor substrate included in the liquid crystal display 100 are described.

Figure 2:
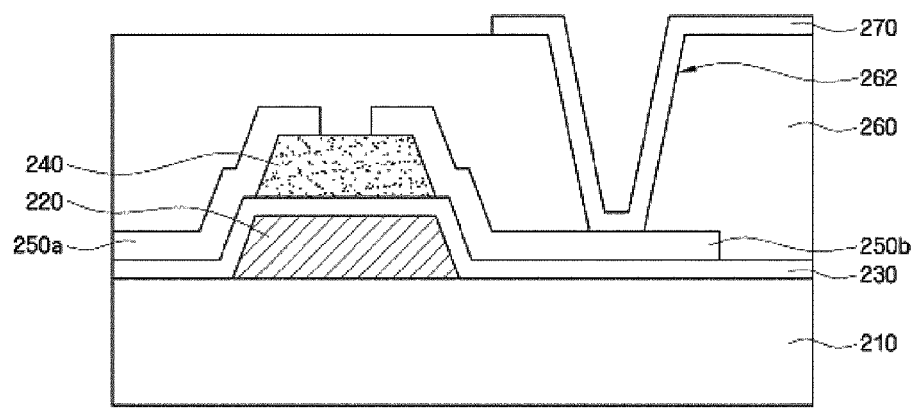
FIG. 2 is a sectional view of a thin film transistor substrate according to exemplary embodiments of the present invention.

FIG. 2 is a sectional view of a thin film transistor substrate according to exemplary embodiments of the present invention. Referring to FIG. 2, the structure of the thin film transistor substrate and a method of manufacturing the same according to exemplary embodiments of the present invention are described.

First, the structure of the thin film transistor substrate according to exemplary embodiments of the present invention is described.

Referring to FIG. 2, the thin film transistor substrate includes a thin film transistor which is arranged on an insulating substrate 210 and which includes a gate electrode 220, source electrode 250a and drain electrodes 250b, and a crystalline oxide semiconductor layer 240, and a pixel electrode 270 that is switched by the thin film transistor.

Specifically, the gate electrode 220 is arranged on the insulating substrate 210. The gate electrode 220 receives a gate signal through a gate line (not illustrated). In this example, the insulating substrate 210 may be made of transparent glass or plastic, and the gate electrode 220 may be made of a single layer or a multilayer that may include copper (Cu), molybdenum (Mo), aluminum (Al), silver (Ag), titanium (Ti), niobium (Nb), tungsten (W), chrome (Cr), tantalum (Ta), and their alloys. As an example of a single layer, the gate electrode 220 may be a layer made of a signal metal of molybdenum, and as an example of a multilayer, the gate electrode may be a double layer of Cr/Al, a double layer of Ti/Cu, or a triple layer of Mo/Al/Mo.

A gate insulating layer 230 is arranged on the insulating substrate 210 and the gate electrode 220. The gate insulating layer 230 may be made of silicon oxide SiOx or silicon nitride SiNx. Also, the gate insulating layer 230 may include aluminum oxide, titanium oxide, tantalum oxide, or zirconium oxide.

A crystalline oxide semiconductor layer 240 is arranged as an active layer on the gate insulating layer 230 for forming a channel region of the thin film transistor, and such a crystalline oxide semiconductor layer 240 is arranged so as to overlap at least the gate electrode 220. In this example, the crystalline oxide semiconductor layer 240 is used since the crystalline oxide semiconductor has a large energy band gap and a low light absorption rate in comparison to an amorphous oxide semiconductor, and thus the influence of the light upon the thin film transistor can be reduced. The details thereof will be described later. The crystalline oxide semiconductor layer 240 includes an oxide material selected from one of Zn, In, Ga, Sn, Hf, or any combinations thereof. Also, the crystalline oxide semiconductor layer 240 may further include a third element. The third element may be Ta, La, Nd, Ce, Sc, Cr, Co, Nb, Mo, Ba, Gd, Ti, W, Pd, Ur, Ni, Mn, or Si. For example, the crystalline oxide semiconductor layer 240 may be made of a material such as ZnO, InZnO, InGaO, InSnO, ZnSnO, GaSnO, GaZnO, GaZnSnO, GaInZnO, HfInZnO, TaInSnO, SiGaInZnO, or HfGaInZnO.

On the gate insulating layer 230 and the crystalline oxide semiconductor layer 240, the source electrode 250a of which at least a portion overlaps the crystalline oxide semiconductor layer 240, and the drain electrode 250b which is spaced apart from the source electrode 250a to face the source electrode 250a around the channel region of the crystalline oxide semiconductor layer 240 and of which at least a portion overlaps the crystalline oxide semiconductor layer 240 are arranged. The source electrode 250a receives the data signal through a data line (not illustrated) that extends in a direction crossing the gate line. Here, the source electrode 250a and the drain electrode 250b may be formed of a single layer or a multilayer that includes copper (Cu), molybdenum (Mo), aluminum (Al), silver (Ag), titanium (Ti), niobium (Nb), tungsten (W), chrome (Cr), tantalum (Ta), or their alloys. For example, the source electrode 250a and the drain electrode 250b may be formed of a double layer of Ti/Cu.

Although not illustrated in the drawing, in order to lower the contact resistance, a material that forms ohmic contact may be interposed between the source electrode 250a and the crystalline oxide semiconductor layer 240 and between the drain electrode 250b and the crystalline oxide semiconductor layer 240.

A protection layer 260 is arranged on the source electrode 250a and the drain electrode 250b and the crystalline oxide semiconductor layer 240 that is exposed by the source electrode 250a and the drain electrode 250b. The protection layer 260, for example, may have a single layer or a multilayer structure that includes silicon oxide, silicon nitride, an organic material having the photosensitivity, or an insulating material having low dielectric constant, such as a-Si:C:O or a-Si:O:F. In the protection layer 260, a contact hole 262 for exposing a portion of the drain electrode 250b, i.e. an end portion of the drain electrode 250b, is formed.

On the protection layer 260, a pixel electrode 270 that is electrically connected to the drain electrode 250b through the contact hole 262 is arranged. The pixel electrode 270 may be made of a transparent conductor such as ITO (Indium Tin Oxide) or IZO (Indium Zinc Oxide).

Next, a method of manufacturing a thin film transistor substrate according to exemplary embodiments of the present invention is described.

Referring again to FIG. 2, the gate electrode 220 is formed on the insulating substrate 210 by depositing a metal layer for the gate electrode on the insulating substrate 210 and patterning the deposited metal layer. Here, the deposition of the metal layer for the gate electrode may be performed by a sputtering method and the patterning the deposited metal layer may be performed by a photolithography process. The photolithography process may include a photo process for coating photoresist on the metal layer for the gate electrode and exposing and developing the photoresist using a mask, and an etching process for removing the metal layer for the gate electrode, which has been exposed by the photoresist pattern formed by the photo process, in a dry or wet etching method.

The gate insulating layer 230 is formed on the insulating substrate 210 and the gate electrode 220 by a sputtering or CVD (Chemical Vapor Deposition) method.

The crystalline oxide semiconductor layer 240 is formed by forming a crystalline oxide semiconductor material on the gate insulating layer 230 and patterning the formed crystalline oxide semiconductor material. Here, the forming of the crystalline oxide semiconductor material may be performed by a reactive sputtering method using argon (Ar) gas and oxygen (O2) gas, and the oxide semiconductor material is crystallized by adjusting the partial pressure ratio of argon (Ar) gas to oxygen (O2) gas (Ar/O2). In other words, by performing the reactive sputtering in a state where the temperature is increased over a predetermined value and the partial pressure ratio of argon gas to oxygen gas is decreased below a predetermined value, the crystalline oxide semiconductor material is formed. Here, the temperature may be, for example, equal to or higher than about 200° C., and the partial pressure ratio of the argon gas to the oxygen gas may be equal to or smaller than about 0.65. However, the present invention is not limited thereto, and the temperature and the partial pressure ratio may be adjusted based on the complete crystallization of the oxide semiconductor material.

The source electrode 250a and the drain electrode 250b are formed by depositing a metal layer for the source electrode 250a and the drain electrode 250b on the gate insulating layer 230 and the crystalline oxide semiconductor layer 240, and patterning the deposited metal layer.

The protection layer 260 is deposited on the whole resultant structure that includes the source electrode 250a and the drain electrode 250b, and then the contact hole 262 that exposes a portion of the drain electrode 250b, i.e. the end portion of the drain electrode 250b, is formed by patterning the protection layer 260 in a photolithography process.

The pixel electrode 270 electrically connected to the drain electrode 250b through the contact hole 262 is formed by forming a conduction layer for the pixel electrode, for example, the ITO or IZO material on the protection layer 260 that includes the contact hole 262, and patterning the formed conduction layer.

Figure 3A:
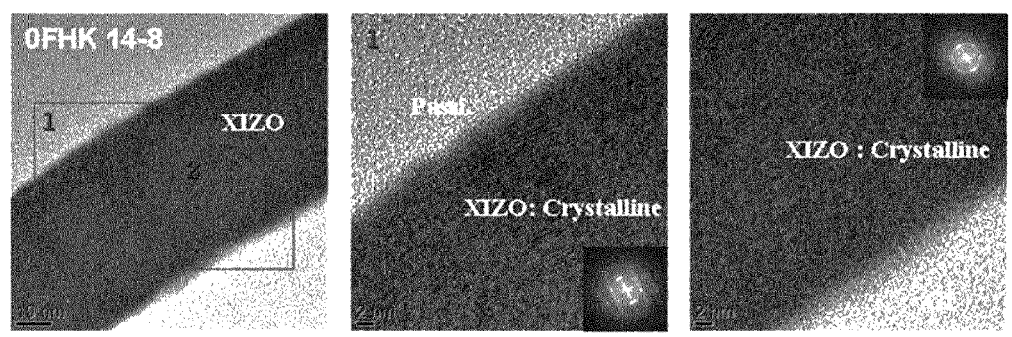
FIG. 3A is a diagram using a Transmission Electron Microscopy (TEM) showing a portion of a cross-section of a thin film transistor including a crystalline HfInZnO layer.
Figure 3B:
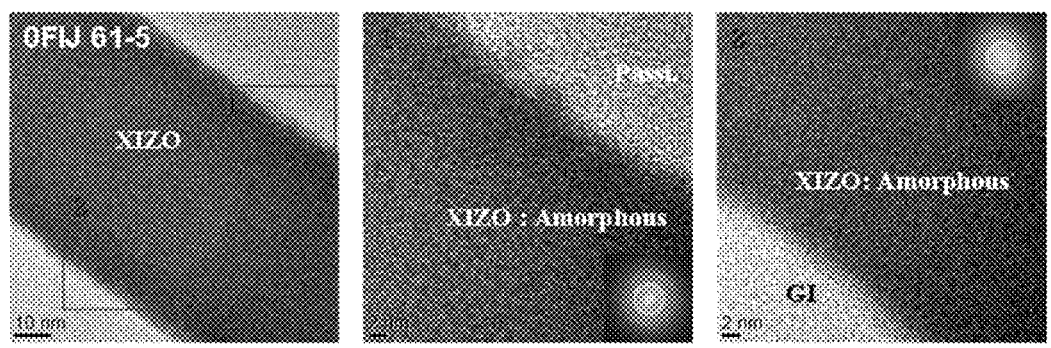
FIG. 3B is a diagram using a TEM showing a portion of a cross-section of a thin film transistor including an amorphous HfInZnO layer.

Hereinafter, the characteristics of the crystalline oxide semiconductor layer, which is used as an active layer of the thin film transistor in the thin film transistor substrate according to exemplary embodiments of the present invention, are examined, and then the electrical characteristics of the thin film transistor are described First, as an experimental example for examining the characteristics of the crystalline oxide semiconductor layer, a thin film transistor that includes a crystalline HfInZnO layer is formed, and as a comparative example thereof, a thin film transistor that includes an amorphous HfInZnO layer is formed as illustrated in FIG. 3A and FIG. 3B.

FIG. 3A is a diagram using a TEM showing a portion of the cross-section of a thin film transistor including a crystalline HfInZnO layer, and FIG. 3B is a diagram using a TEM picture showing a portion of the cross-section of a thin film transistor including an amorphous HfInZnO layer.

Referring to FIG. 3A, the crystalline HfInZnO layer in this experimental example has been crystallized as a whole from the interface with the lower gate insulating layer (see GI of FIG. 3A) to the interface with the upper protection layer (see Passi. of FIG. 3A).

This crystalline HfInZnO layer is formed in a reactive sputtering method using argon (Ar) gas and oxygen (O2), and particularly, in a state where the partial pressure ratio of argon gas to oxygen gas (Ar/O2) is set to 35/63 or 55/90 at a deposition temperature of about 200° C.

By contrast, referring to FIG. 3B, the amorphous HfInZnO layer in the comparative example is amorphous as a whole from the interface with the lower gate insulating layer (see GI of FIG. 3B) to the interface with the upper protection layer (see Passi. of FIG. 3B).

This amorphous HfInZnO layer is formed in a reactive sputtering method using argon (Ar) gas and oxygen (O2) in the same manner as the method of manufacturing the crystalline HfInZnO layer, and particularly, in a state where the partial pressure ratio of argon gas to oxygen gas (Ar/O2) is set to 35/7 or 55/10 at a deposition temperature of about 100° C. In other words, the amorphous HfInZnO layer is formed in a processing condition that the temperature is low and the partial pressure ratio of argon gas to oxygen gas is high in comparison to the crystalline HfInZnO layer.

Figure 4:
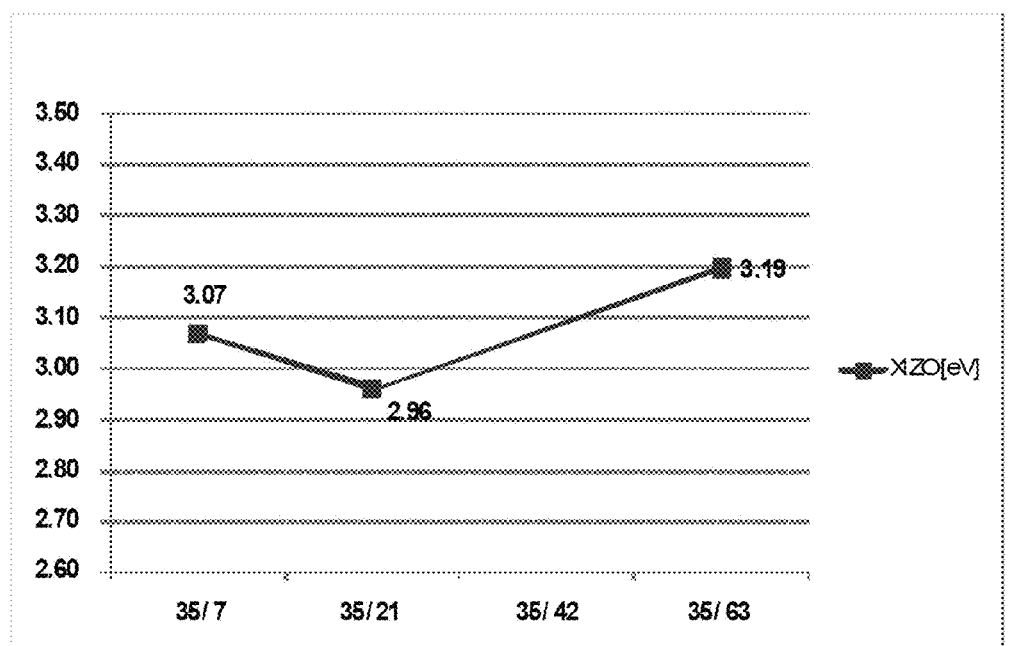
FIG. 4 is a graph showing exemplary data of measuring an energy band gap of an oxide semiconductor layer according to partial pressures of oxygen gas and argon gas.

Next, the energy band gap among the characteristics of the crystalline oxide semiconductor layer is examined, and for this analysis, energy band gaps of a crystalline HfInZnO layer of an experimental example and an amorphous HfInZnO layer in a comparative example are measured. FIG. 4 illustrates the result of measurement.

FIG. 4 is a graph showing exemplary data of measuring an energy band gap of an oxide semiconductor layer according to partial pressures of oxygen gas and argon gas, in which an energy band gap of a crystalline HfInZnO layer and an energy band gap of an amorphous HfInZnO layer are particularly shown.

Referring to FIG. 4, the energy band gap of an oxide semiconductor layer, i.e. an amorphous HfInZnO layer, which is formed in a state where the partial pressure ratio of argon gas to oxygen gas is 35/7, is about 3.07 eV, whereas the energy band gap of an oxide semiconductor layer, i.e. a crystalline HfInZnO layer, which is formed in a state where the partial pressure ratio of the argon gas to the oxygen gas is 35/63, is about 3.19 eV, which is relatively larger than the energy band gap of the amorphous HfInZnO layer.

The fact that the energy band gap of the crystalline oxide semiconductor layer is larger than the energy band gap of the amorphous oxide semiconductor layer means the following in relation to the electrical characteristics of a thin film transistor.

When a thin film transistor that has an oxide semiconductor layer as an active layer is irradiated with light, electrons in the band gap of the oxide semiconductor layer are excited by energy of the light, and holes which are generated accordingly are trapped into a layer that neighbors the oxide semiconductor layer, i.e. a gate insulating layer or a protection layer. In particular, if the holes are trapped into the gate insulating layer, the threshold voltage of the thin film transistor is varied, and as a result, the characteristics of the thin film transistor cannot stably be secured.

However, if the energy band gap of the oxide semiconductor layer is large, it is difficult for the electrons to be excited even though the light is irradiated, and thus the phenomenon that the holes are trapped into the gate insulating layer in the thin film transistor is reduced. As a result, the phenomenon that the electric characteristics of the thin film transistor are changed due to the variation of the threshold voltage is reduced.

Accordingly, if the crystalline oxide semiconductor layer having a relatively large energy band gap is used as the active layer of the thin film transistor, it is less influenced by the light in comparison to the case in which the amorphous oxide semiconductor layer is used. That is, the change of the electrical characteristics of the thin film transistor by the light is decreased.

Figure 5:
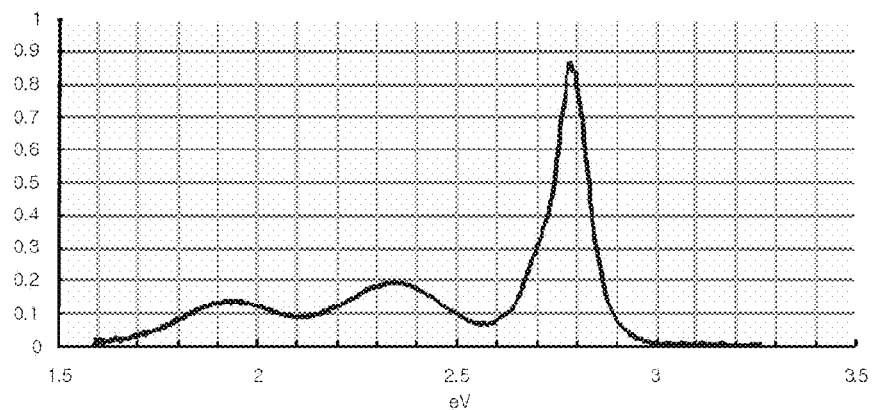
FIG. 5 is a graph illustrating energy distribution of light generated from an LED light source.
Figure 6:
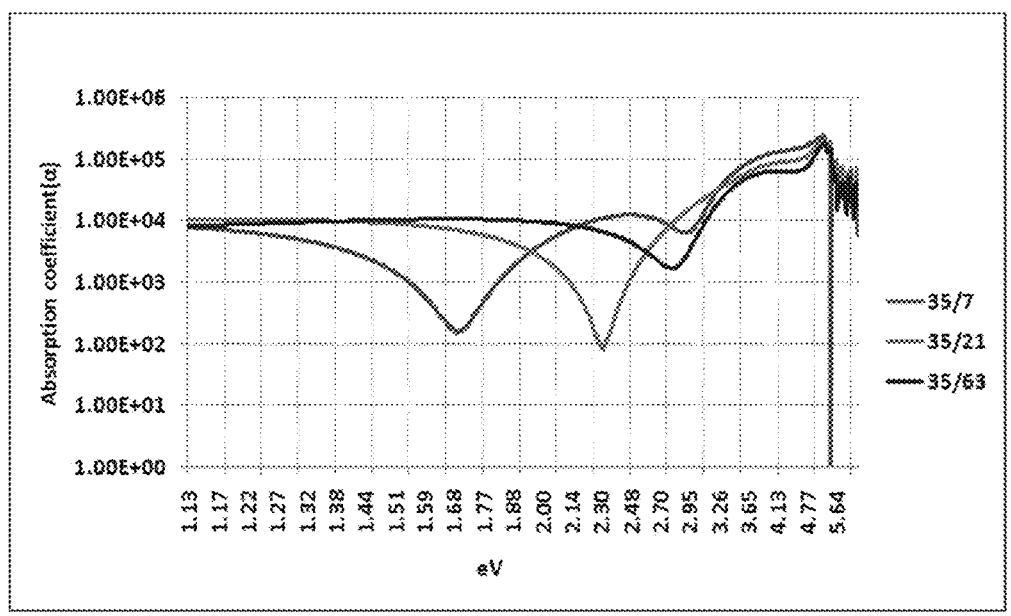
FIG. 6 is a graph showing exemplary data of an absorption coefficient of an oxide semiconductor layer according to energy of light with which a thin film transistor is irradiated.

Next, a DOS (Density Of State) among the characteristics of the crystalline oxide semiconductor layer is examined, and for this, energy distribution of light generated from an LED that is used as a light source of a backlight unit and an absorption coefficient of a crystalline HfInZnO layer in an experimental example and an amorphous HfInZnO layer in a comparative example are measured. FIG. 5 and FIG. 6 show the result of measurement.

FIG. 5 is a graph illustrating energy distribution of light generated from an LED light source.

Referring to FIG. 5, the energy region of the light that indicates 50% or more of the light intensity in the LED light source corresponding to the range of about 2.75 to 2.85 eV. This means that when the thin film transistor of the display panel is irradiated with the light generated from the LED light source, the light having the energy region of about 2.75 to 2.85 eV exerts the greatest influence upon the thin film transistor. This is described in detail with reference to the graph of FIG. 6.

FIG. 6 is a graph measuring an absorption coefficient of an oxide semiconductor layer according to energy of light with which a thin film transistor is irradiated. This graph particularly shows the absorption coefficients of the crystalline HfInZnO layer and the amorphous HfInZnO layer.

Referring to FIG. 6, it can be seen that in the energy region of the light that indicates 50% or more of the light intensity, i.e. in the range of about 2.75 to 2.85 eV, in the LED light source, the absorption coefficient of the oxide semiconductor layer, i.e. the amorphous HfInZnO layer, which is formed in a state where the partial pressure ratio of the argon gas to the oxygen gas is 35/7 is larger than the absorption coefficient of the oxide semiconductor layer, i.e. the crystalline HfInZnO layer, which is formed in a state where the partial pressure ratio of the argon gas to the oxygen gas is 35/63.

The fact that the absorption coefficient of the crystalline oxide semiconductor layer is smaller than the absorption coefficient of the amorphous oxide semiconductor layer means the following in relation to the DOS characteristics of the crystalline oxide semiconductor layer and the electrical characteristics of a thin film transistor.

The DOS indicates density of particles, for example, electrons having an energy level that corresponds to the inside of the energy band gap of a specified semiconductor. The fact that the DOS is high means that the density of electrons in the energy band gap is high and there are lots of electrons that can be excited by the light energy when the semiconductor is irradiated with the light. That is, the high DOS means the high light reactivity. If the density of electrons in the energy band gap is high, lots of holes are generated due to the excitation of the electrons, and are trapped into the gate insulating layer that neighbors the oxide semiconductor layer to deepen the variation of the characteristics such as the threshold voltage of the thin film transistor.

Since it is difficult to directly measure the DOS, the DOS of the oxide semiconductor layer is indirectly measured using the absorption coefficient. In other words, the fact that the absorption coefficient of the oxide semiconductor layer is small means that the oxide semiconductor layer absorbs less light, that is, the oxide semiconductor layer reacts less on the light, and through this, it can be recognized that the DOS of the oxide semiconductor layer is low.

Accordingly, the fact that the absorption coefficient of the crystalline oxide semiconductor layer is smaller than the absorption coefficient of the amorphous oxide semiconductor layer means that the crystalline oxide semiconductor layer has low DOS and thus is less influenced by the light. As a result, the change of the electrical characteristics of the thin film transistor that uses the above-described crystalline oxide semiconductor layer as the active layer is decreased in comparison to the thin film transistor that uses the above-described amorphous oxide semiconductor layer as the active layer.

With reference to the experimental results as illustrated in FIG. 3A, FIG. 3B, FIG. 4, FIG. 5 and FIG. 6, the features according to exemplary embodiments of the present invention are summarized as follows. The crystalline oxide semiconductor layer has a larger energy band gap and lower DOS and absorption coefficient in comparison to the amorphous oxide semiconductor layer, and thus it can be known that its light reactivity is lower than that of the amorphous oxide semiconductor layer. Accordingly, the thin film transistor that uses the crystalline oxide semiconductor layer as the active layer can stably secure the electrical characteristics such as the threshold voltage.

Meanwhile, according to exemplary embodiments of the present invention, it is contemplated that the thin film transistor has a bottom gate structure in which the gate electrode is positioned on the lower part of the gate insulating layer and the active layer made of the crystalline oxide semiconductor and the source electrode and drain electrode are positioned on the upper part of the gate insulating layer. However, the present invention is not limited thereto. That is, exemplary embodiments of the present invention can also be applied to a thin film transistor having a top gate structure in which the gate electrode is positioned on the upper part of the gate insulating layer and the active layer made of the crystalline oxide semiconductor and the source electrode and drain electrode are positioned on the lower part of the gate insulating layer, or to a thin film transistor having a double gate structure in which the active layer made of the crystalline oxide semiconductor and the source electrode and drain electrode are arranged in an intermediate layer and gate electrodes are arranged on the upper part and the lower part of the intermediate layer through gate insulating layers, respectively.

Figure 8:
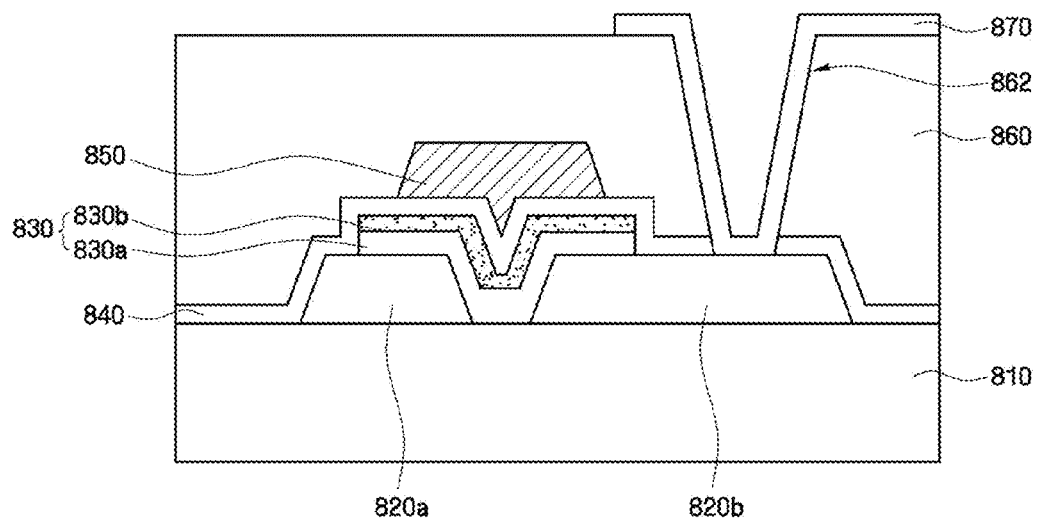
FIG. 8 is a sectional view of a thin film transistor substrate according to exemplary embodiments of the present invention.
Figure 9:
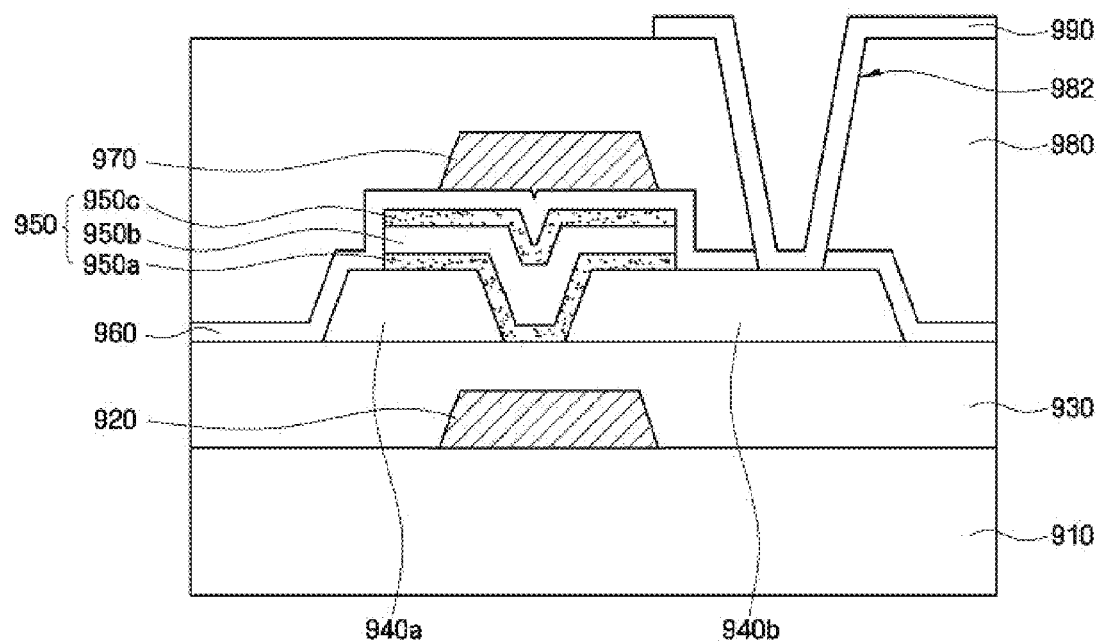
FIG. 9 is a sectional view of a thin film transistor substrate according to exemplary embodiments of the present invention.

Since the detailed constructions of the thin film transistor having the top gate structure and the thin film transistor having the double gate structure are illustrated in FIG. 8 and FIG. 9, the detailed explanation thereof will be omitted in order to avoid unnecessarily obscuring the invention.

Figure 7:
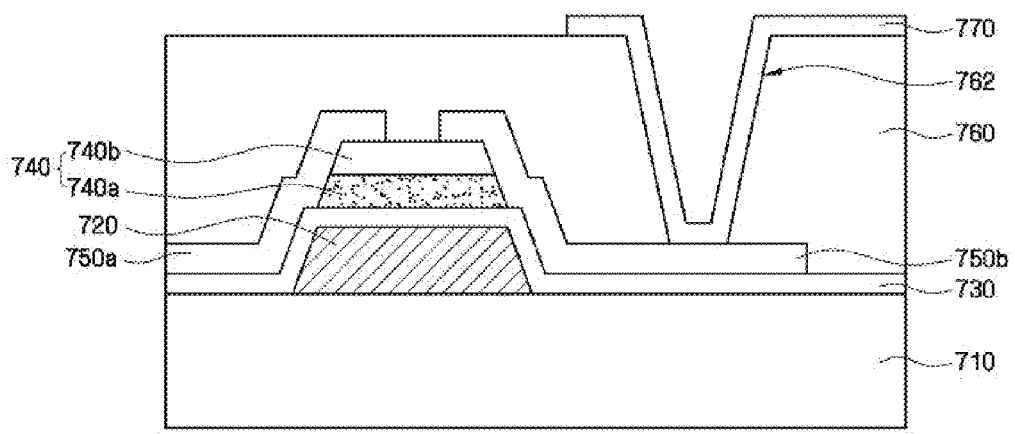
FIG. 7 is a sectional view of a thin film transistor substrate according to exemplary embodiments of the present invention.

FIG. 7 is a sectional view of a thin film transistor substrate according to exemplary embodiments of the present invention. Referring to FIG. 7, the structure of the thin film transistor substrate and a method of manufacturing the same according to exemplary embodiments of the present invention are described. The thin film transistor substrate as illustrated in this drawing is substantially the same as that according to exemplary embodiments of the present invention as illustrated in FIG. 2, except that the active layer of the thin film transistor has a double-layer structure composed of a crystalline oxide semiconductor layer and an amorphous oxide semiconductor layer. Accordingly, with respect to the constituent elements substantially the same as those explained with reference to FIG. 2, the detailed explanation thereof will be omitted in order to avoid unnecessarily obscuring the invention.

First, the structure of the thin film transistor substrate according to exemplary embodiments of the present invention is described.

Referring to FIG. 7, the thin film transistor substrate includes a thin film transistor which is arranged on an insulating substrate 710 and which includes a gate electrode 720, a source electrode 750a and a drain electrode 750b, and an active layer 740 in which a crystalline oxide semiconductor layer 740a and an amorphous oxide semiconductor layer 740b are laminated, and a pixel electrode 770 that is switched by the thin film transistor.

Specifically, the gate electrode 720 is arranged on the insulating substrate 710.

On the insulating substrate 710 and the gate electrode 720, a gate insulating layer 730 is arranged.

On the gate insulating layer 730, the active layer 740 in which the crystalline oxide semiconductor layer 740a and the amorphous oxide semiconductor layer 740b are laminated is arranged. Here, the crystalline oxide semiconductor layer 740a forms a lower layer of the active layer 740 so as to be adjacent to the gate insulating layer 730, and the amorphous oxide semiconductor layer 740b forms an upper layer of the active layer 740 so as not to be adjacent to the gate insulating layer 730.

The crystalline oxide semiconductor layer 740a and the amorphous oxide semiconductor layer 740b include an oxide material selected from one of Zn, In, Ga, Sn, Hf, or any combinations thereof. Also, they may further include a third element. The third element may be Ta, La, Nd, Ce, Sc, Cr, Co, Nb, Mo, Ba, Gd, Ti, W, Pd, Ur, Ni, Mn, or Si. For example, the crystalline oxide semiconductor layer 740a and the amorphous oxide semiconductor layer 740b may be made of a material such as ZnO, InZnO, InGaO, InSnO, ZnSnO, GaSnO, GaZnO, GaZnSnO, GaInZnO, HfInZnO, TaInSnO, SiGaInZnO, or HfGaInZnO. The ratio of contents (atomic %) of metal elements except for oxygen in the crystalline oxide semiconductor layer 740a may substantially be the same as the ratio of contents (atomic %) of metal elements except for oxygen in the amorphous oxide semiconductor layer 740b. However, exemplary embodiments of the present invention may not be limited thereto. For example, in considering only the ratio of metal atoms except for oxygen atoms in the case where the composition of the crystalline oxide semiconductor layer 740a and the amorphous oxide semiconductor layer 740b is GaInZnO, the ratio of Ga:In:Zn may be x:y:z (where, x, y, z are integers that are larger than 0) in the crystalline oxide semiconductor layer 740a and the amorphous oxide semiconductor layer 740b, respectively. If the ratio is 1:1:1, the oxide semiconductor layer includes 33 at % of Ga, 33 at % of In, and 33 at % of Zn among the whole metal elements.

In this example, one of reasons of using the active layer 740 is because the crystalline oxide semiconductor has lower charge mobility in comparison to the amorphous oxide semiconductor. In other words, the thin film transistor including the crystalline oxide semiconductor may be less influenced by the light, but may not satisfy the required mobility. Accordingly, the active layer 740 that includes both the crystalline oxide semiconductor layer 740a and the amorphous oxide semiconductor layer 740b is proposed so that the thin film transistor can satisfy the required mobility while it is less influenced by the light. Further, the purpose of arranging the crystalline oxide semiconductor layer 740a to be adjacent to the gate insulating layer 730 is to prevent the change of the characteristics of the thin film transistor that is caused by the trapping of holes into the gate insulating layer 730 when the thin film transistor is irradiated with light.

On the gate insulating layer 730 and the active layer 740, the source electrode 750a of which at least a portion overlaps the active layer 740, and the drain electrode 750b which is spaced apart from the source electrode 750a to face the source electrode 750a around the channel region of the active layer 740 and of which at least a portion overlaps the active layer 740 are arranged.

A protection layer 760 is arranged on the source electrode 750a and the drain electrode 750b and the active layer 740 that is exposed by the source electrode 750a and the drain electrode 750b. In the protection layer 760, a contact hole 762 that exposes a portion of the drain electrode 750b is formed.

On the protection layer 760, a pixel electrode 770 that is electrically connected to the drain electrode 750b through the contact hole 762 is arranged.

Next, a method of manufacturing a thin film transistor substrate according to exemplary embodiments of the present invention is described.

Referring again to FIG. 7, the gate electrode 720 and the gate insulating layer 730 are formed on the insulating substrate 710.

By sequentially forming the crystalline oxide semiconductor material and the amorphous oxide semiconductor material on the gate insulating layer 730 and patterning the sequentially formed material, the active layer 740 is formed in which the crystalline oxide semiconductor layer 740a and the amorphous oxide semiconductor layer 740b are laminated.

Here, the forming of the crystalline oxide semiconductor material and the amorphous oxide semiconductor material may be performed by a reactive sputtering method using argon (Ar) gas and oxygen (O2) gas, and in particular, by adjusting the temperature and the partial pressure ratio of the argon gas to the oxygen gas (Ar/O2), the crystalline oxide semiconductor material and the amorphous oxide semiconductor material can be sequentially formed. In other words, by performing the reactive sputtering in a state where the temperature is set to a first temperature that is over a predetermined value and the partial pressure ratio of the argon gas to the oxygen gas is set to a first partial pressure ratio that is below a predetermined value, the crystalline oxide semiconductor material is formed, and by performing the reactive sputtering in a state where the temperature is set to a second temperature that is lower than the first temperature and the partial pressure ratio of the argon gas to the oxygen gas is set to a second partial pressure ratio that is higher than the first partial pressure ratio, the amorphous oxide semiconductor material is formed. For example, the first temperature may be equal to or higher than about 200° C. and the first partial pressure ratio may be equal to or smaller than 0.65, while the second temperature may be about 100° C. and the second partial pressure ratio may be equal to or larger than 5. However, the present invention is not limited thereto, and the first temperature and the second temperature and the first partial pressure ratios and the second partial pressure ratios may be adjusted based on the complete crystallization or amorphous state of the oxide semiconductor material.

Then, on the gate insulating layer 730 and the active layer 740, the source electrode 750a and the drain electrode 750b, the protection layer 760 having the contact hole 762 for exposing the drain electrode 750b, and the pixel electrode 770 that electrically connects to the drain electrode 750b through the contact hole 762 are sequentially formed.

Hereinafter, in the thin film transistor substrate according to exemplary embodiments of the present invention, the mobility and the threshold voltage as the electrical characteristics of the thin film transistor that includes the active layer in which the crystalline oxide semiconductor layer and the amorphous oxide semiconductor layer are laminated are examined. For this analysis, the thin film transistor having a bottom gate structure including the active layer in which the crystalline HfInZnO layer and the amorphous HfInZnO layer are sequentially laminated that is formed and the mobility and the threshold voltage of the thin film is transistor are measured. In particular, the mobility and the threshold voltage are measured as changing the thickness ratio of the crystalline HfInZnO layer and the amorphous HfInZnO layer. The results of measurement are shown in Table 1 and Table 2 below.

TABLE 1

| Crystalline/Amorphous | Mobility | | |
|---|---|---|---|
| Thicknesses | First | Second | Average |
| 0/500 | 6.76 | 8.62 | 7.69 |
| 50/450 | 9.7 | 8.84 | 9.27 |
| 100/400 | 7.65 | 9.66 | 8.655 |
| 200/300 | 7.8 | | 7.8 |
| 300/200 | 3.84 | | 3.84 |

TABLE 2

| Crystalline/Amorphous | Threshold Voltage | | |
|---|---|---|---|
| Thicknesses | First | Second | Average |
| 0/500 | 0.73 | −1.18 | −0.225 |
| 50/450 | 1.05 | 1.05 | 1.05 |
| 100/400 | 1.27 | 1.14 | 1.205 |
| 200/300 | 1.27 | | 1.27 |
| 300/200 | 2.09 | | 2.09 |

Referring to Table 1, if the thickness of the crystalline oxide semiconductor layer is smaller than the thickness of the amorphous oxide semiconductor layer, the mobility of the thin film transistor is not greatly decreased. However, if the thickness of the crystalline oxide semiconductor layer becomes larger than the thickness of the amorphous oxide semiconductor layer (see the case in which the crystalline/amorphous thicknesses are 300/200), the mobility of the thin film transistor is abruptly decreased. Accordingly, it is recognized that it is preferable to use the amorphous oxide semiconductor layer having a relatively large thickness together with the crystalline oxide semiconductor layer in order to satisfy the mobility required in the thin film transistor.

Referring to Table 2, it is understood that the threshold voltage of the thin film transistor is increased as the thickness of the crystalline oxide semiconductor layer becomes larger than the thickness of the amorphous oxide semiconductor layer. This facilitates the control of the turn-on operation of the thin film transistor.

As a result, with reference to the experimental results shown in Table 1 and Table 2, by using both the crystalline oxide semiconductor layer and the amorphous oxide semiconductor layer as the active layer of the thin film transistor and appropriately controlling the thicknesses of the crystalline oxide semiconductor layer and the amorphous oxide semiconductor layer, the required mobility and threshold voltage of the thin film transistor can be secured. Further, by arranging the crystalline oxide semiconductor layer adjacent to the gate insulating layer, for example, by arranging the crystalline oxide semiconductor layer on the lower part of the bottom gate structure, the influence of the light upon the thin film transistor can be reduced as described above.

FIG. 8 is a sectional view of a thin film transistor substrate according to exemplary embodiments of the present invention. Hereinafter, referring to FIG. 8, the structure of the thin film transistor substrate and a method of manufacturing the same according to the exemplary embodiments of the present invention are described. The thin film transistor substrate as illustrated in this drawing is substantially the same as that according to exemplary embodiments of the present invention as illustrated in FIG. 7, except that the thin film transistor substrate has a top gate structure in which the gate electrode is positioned on the upper part of the gate insulating layer of the thin film transistor and the active layer and the source electrode and drain electrode are positioned on the lower part of the gate insulating layer, and thus the lower layer of the active layer is the amorphous oxide semiconductor layer and the upper layer thereof is the crystalline oxide semiconductor layer. Accordingly, with respect to the constituent elements substantially the same as those explained with reference to FIG. 7, the detailed explanation thereof will be omitted in order to avoid unnecessarily obscuring the invention.

First, the structure of the thin film transistor substrate according to exemplary embodiments of the present invention is described.

Referring to FIG. 8, the thin film transistor substrate includes a thin film transistor which is arranged on an insulating substrate 810 and which includes source electrode 820*a* and drain electrode 820*b*, an active layer 830 in which an amorphous oxide semiconductor layer 830*a* and a crystalline oxide semiconductor layer 830*b* are sequentially laminated, and a gate electrode 850, and a pixel electrode 870 that is switched by the thin film transistor.

Specifically, on the insulating substrate 810, the source electrode 820*a* and the drain electrode 820*b*, which is spaced apart from the source electrode 820*a* and which is opposite to the source electrode 820*a* around a channel region of the active layer 830 which will be more fully describe later, are arranged.

On the source electrode 820*a* and the drain electrode 820*b*, the active layer 830, which covers a gap space between the source electrode 820*a* and the drain electrode 820*b*, of which at least a portion overlaps the source electrode 820*a*, and of which at least a portion overlaps the drain electrode 820*b*, is arranged.

Here, the active layer 830 has a structure in which the amorphous oxide semiconductor layer 830*a* and the crystalline oxide semiconductor layer 830*b* are sequentially laminated. In this example, the crystalline oxide semiconductor layer 830*b* is arranged on the upper part of the amorphous oxide semiconductor layer 830*a* because the gate insulating layer 840 which will be more fully described later is positioned on the upper part of the active layer 830. That is, by arranging the crystalline oxide semiconductor layer 830*b* adjacent to the gate insulating layer 840, the phenomenon that the holes are trapped into the gate insulating layer 840 can be reduced even if the thin film transistor is irradiated with light.

On the source electrode 820*a*, the drain electrode 820*b* and the active layer 830, the gate insulating layer 840 is arranged, and on the gate insulating layer 840, the gate electrode 850 that overlaps at least the active layer 830 is arranged.

On the gate insulating layer 840 and the gate electrode 850, a protection layer 860 is arranged. Here, in the protection layer 860 and the gate insulating layer 840, a contact hole 862 for exposing the drain electrode 820*b* is formed.

On the protection layer 860, the pixel electrode 870 for electrically connecting to the drain electrode 820*b* through the contact hole 862 is formed.

Next, a method of manufacturing a thin film transistor substrate according to exemplary embodiments of the present invention is described.

Referring again to FIG. 8, the source electrode 820*a* and the drain electrode 820*b* are formed by depositing a metal layer for the source electrode 820*a* and the drain electrode 820*b* on the insulating substrate 810, and then patterning the deposited metal layer.

By sequentially forming the amorphous oxide semiconductor material and the crystalline oxide semiconductor material on the insulating substrate 810 and the source electrode 820*a* and the drain electrode 820*b*, and patterning the sequentially formed material, the active layer 830 is formed in which the amorphous oxide semiconductor layer 830*a* and the crystalline oxide semiconductor layer 830*b* are laminated. Here, the method of forming the amorphous oxide semiconductor material and the crystalline oxide semiconductor material is the same as exemplary embodiments of the present invention which is previously discussed with respect to the FIG. 7, but the forming order is different from the exemplary embodiments, that is, only on the point that the amorphous oxide semiconductor material is firstly formed, and then the crystalline oxide semiconductor material is formed.

In this example, on the source electrode 820*a*, the drain electrode 820*b* and the active layer 830, the gate insulating layer 840 is formed.

The gate electrode 850 is formed by depositing the metal layer for the gate electrode on the gate insulating layer 840, and then patterning the deposited metal layer.

The protection layer 860 is formed on the gate insulating layer 840 and the gate electrode 850, and then the contact hole 862 for exposing the drain electrode 820*b* is formed by collectively etching the protection layer 860 and the gate insulating layer 840 in the photolithography method. On the protection layer 860, the pixel electrode 870 for electrically connecting to the drain electrode 820*b* through the contact hole 862 is formed.

The thin film transistor according to exemplary embodiments with respect to FIG. 8 has substantially the same feature as that of the thin film transistor according to exemplary embodiments with respect to FIG. 7. That is, since the active layer that is adjacent to the gate insulating layer is the crystalline oxide semiconductor layer, it is less affected by the light, and since the active layer includes both the crystalline oxide semiconductor layer and the amorphous oxide semiconductor layer, the mobility and threshold voltage characteristics can be satisfied.

Meanwhile, according to exemplary embodiments of the present invention with respect to FIG. 8, the top gate structure in which the source electrode and the drain electrode are positioned on the lower part and the active layer is positioned on the upper part. However, the exemplary embodiments of the present invention is not limited thereto, and it is apparent to a person skilled in the art that the present invention can also be applied to another top gate structure in which the active layer is positioned on the lower part and the source electrode and the drain electrode are positioned on the upper part.

FIG. 9 is a sectional view of a thin film transistor substrate according to exemplary embodiments of the present invention. Hereinafter, referring to FIG. 9, the structure of the thin film transistor substrate and a method of manufacturing the same are described. The thin film transistor substrate as illustrated in this drawing is substantially the same as exemplary embodiments of the present invention with respect to FIG. 8, except that the thin film transistor substrate has a double gate structure in which the active layer and the source electrode and the drain electrode are arranged in an intermediate layer and two gate electrodes are arranged on the upper part and the lower part of the intermediate layer through gate insulating layers, respectively, and thus the active layer has a triple-layer structure of the crystalline oxide semiconductor layer/amorphous oxide semiconductor layer/crystalline oxide semiconductor layer. Accordingly, with respect to the constituent elements substantially the same as those explained with reference to FIG. 8, the detailed explanation thereof will be omitted in order to avoid unnecessarily obscuring the invention.

First, the structure of the thin film transistor substrate according to exemplary embodiments of the present invention with respect to FIG. 9 will be described.

Referring to FIG. 9, the thin film transistor substrate includes a thin film transistor which is arranged on an insulating substrate 910 and which includes source electrode 940a and drain electrode 940b, an active layer 950 in which a lower crystalline oxide semiconductor layer 950a, an amorphous oxide semiconductor layer 950b, and an upper crystalline oxide semiconductor layer 950c are sequentially laminated, and lower gate electrode 920 and upper gate electrode 970, and a pixel electrode 990 that is switched by the thin film transistor.

Specifically, on the insulating substrate 910, the lower gate electrode 920 and a lower gate insulating layer 930 that covers the lower gate electrode 920 are arranged. The lower gate electrode 920 is arranged to overlap the active layer 950 which will be more fully described later.

On the lower gate insulating layer 930, the source electrode 940a and the drain electrode 940b, which is spaced apart from the source electrode 940a and which is opposite to the source electrode 940a around a channel region of the active layer 950 are arranged.

On the source electrode 940a and the drain electrode 940b, the active layer 950, which covers a gap space between the source electrode 940a and the drain electrode 940b, of which at least a portion overlaps the source electrode 940a, and of which at least a portion overlaps the drain electrode 940b, is arranged.

Here, the active layer 950 has a structure in which the lower crystalline oxide semiconductor layer 950a, the amorphous oxide semiconductor layer 950b, and the upper crystalline oxide semiconductor layer 950c are sequentially laminated. Unlike exemplary embodiments of the present invention with respect to FIG. 7 and FIG. 8, the crystalline oxide semiconductor layers 950a and 950c are arranged on the upper and lower parts of the amorphous oxide semiconductor layer 950b, respectively, because the gate insulating layers 930 and 960 are positioned on the upper and lower parts of the active layer 950, respectively. That is, by arranging the lower crystalline oxide semiconductor layer 950a adjacent to the lower gate insulating layer 930 and arranging the upper crystalline oxide semiconductor layer 950c adjacent to the upper gate insulating layer 960, the holes are prevented from being trapped into the gate insulating layers 930 and 960.

On the source electrode 940a, the drain electrode 940b and the active layer 950, the upper gate insulating layer 960 is arranged, and on the upper gate insulating layer 960, the upper gate electrode 970 that overlaps at least the active layer 950 is arranged.

Although not illustrated in the drawing, the lower gate electrode 920 and the upper gate electrode 970 may be connected by a conductive plug.

On the gate insulating layer 960 and the upper gate electrode 970, a protection layer 980 is arranged. Here, in the protection layer 980 and the upper gate insulating layer 960, a contact hole 982 for exposing a portion of the drain electrode 940b is formed.

On the protection layer 980, the pixel electrode 990 for electrically connecting to the drain electrode 940b through the contact hole 982 is formed.

Next, a method of manufacturing a thin film transistor substrate according to exemplary embodiments with respect to FIG. 9 of the present invention is described.

Referring again to FIG. 9, the lower gate electrode 920 is formed by depositing a metal layer for the gate electrode on the insulating substrate 910, and then patterning the deposited metal layer. Thereafter, on the insulating substrate 910 and the lower gate electrode 920, the lower gate insulating layer 930 is formed.

A metal layer for the source electrode and the drain electrode is deposited on the lower gate insulating layer 930, and the source electrode 940a and the drain electrode 940b are formed by patterning the deposited metal layer.

By sequentially forming the crystalline oxide semiconductor material, the amorphous oxide semiconductor material, and the crystalline oxide semiconductor material on the lower gate insulating layer 930, the source electrode 940a and the drain electrode 940b and patterning the sequentially formed material, the active layer 950 is formed in which the lower crystalline oxide semiconductor layer 950a, the amorphous oxide semiconductor layer 950b, and the upper crystalline oxide semiconductor layer 950c are sequentially laminated. Here, the method of forming the amorphous oxide semiconductor material and the crystalline oxide semiconductor material is the same as that according to exemplary embodiments of the present invention with respect to FIG. 7 except for the forming order.

On the source electrode 940a, the drain electrode 940b and the active layer 950, the upper gate insulating layer 960 is formed. And the upper gate electrode 970 is formed by depositing metal layer for the gate electrode on the upper gate insulating layer 960, and patterning the deposited metal layer.

The protection layer 980 is formed on the upper gate insulating layer 960 and the upper gate electrode 970, and the contact hole 982 for exposing the drain electrode 940b is formed by collectively etching the protection layer 980 and the upper gate insulating layer 960 in the photolithography method. On the protection layer 980, the pixel electrode 990 for electrically connecting to the drain electrode 940b through the contact hole 982 is formed.

The thin film transistor according to exemplary embodiments with respect to FIG. 9 has substantially the same feature as that of the thin film transistor according to exemplary embodiments with respect to FIG. 7. That is, since the active layer that is adjacent to the gate insulating layer is the crystalline oxide semiconductor layer, it is less affected by the light, and since the active layer includes both the crystalline oxide semiconductor layer and the amorphous oxide semiconductor layer, the mobility and threshold voltage characteristics can be satisfied.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:
1. A thin film transistor, comprising:
a first gate electrode;

an active layer comprising a crystalline oxide semiconductor layer being insulated from the first gate electrode by a first insulating layer, the active layer being arranged to overlap the first gate electrode;

a source electrode and a drain electrode spaced apart from the source electrode;

a second insulating layer; and a second gate electrode, the second gate electrode and the first gate electrode being arranged on opposite sides of the active layer, wherein the second gate electrode is insulated from the active layer by the second insulating layer, wherein the active layer comprises a triple layer comprising a first crystalline oxide semiconductor layer, an amorphous oxide semiconductor layer, and a second crystalline oxide semiconductor layer, and wherein the first crystalline oxide semiconductor layer is arranged adjacent to the first insulating layer, and the second crystalline oxide semiconductor layer is arranged adjacent to the second insulating layer.

2. The thin film transistor of claim 1, wherein the active layer comprises a single layer of the crystalline oxide semiconductor.

3. The thin film transistor of claim 1, wherein the active layer comprises a double layer comprising an amorphous oxide semiconductor layer and a crystalline oxide semiconductor layer are laminated, and the crystalline oxide semiconductor layer is arranged adjacent to the first insulating layer.

4. The thin film transistor of claim 3, wherein the thickness of the amorphous oxide semiconductor layer exceeds the thickness of the crystalline oxide semiconductor layer.

5. The thin film transistor of claim 1, wherein the thickness of the amorphous oxide semiconductor layer exceeds the thickness of the first crystalline oxide semiconductor layer or the thickness of the second crystalline oxide semiconductor layer.

6. The thin film transistor of claim 1, wherein the crystalline oxide semiconductor comprises an oxide material selected from one of Zn, In, Ga, Sn, Hf, or any combinations thereof.

7. The thin film transistor of claim 1, wherein an energy band gap of the crystalline oxide semiconductor exceeds an energy band gap of an amorphous oxide semiconductor.

8. The thin film transistor of claim 1, wherein a light absorption coefficient of the crystalline oxide semiconductor is smaller than a light absorption coefficient of an amorphous oxide semiconductor.

9. The thin film transistor of claim 1, wherein a charge mobility of the crystalline oxide semiconductor is lower than a charge mobility of an amorphous oxide semiconductor.

10. The thin film transistor of claim 1, wherein the degree of variation of a threshold voltage by light irradiation onto the crystalline oxide semiconductor is lower than the degree of variation of a threshold voltage by light irradiation onto an amorphous oxide semiconductor.

11. The thin film transistor of claim 1, wherein the source electrode and the drain electrode are insulated from the first gate electrode by the first insulating layer, and wherein at least a portion of the source electrode overlaps with the active layer, and at least a portion of the drain electrode overlaps with the active layer.

12. A thin film transistor, comprising:

a first gate electrode;

an active layer comprising a crystalline oxide semiconductor and an amorphous oxide semiconductor sequentially being disposed on the active layer and being insulated from the first gate electrode by a first insulating layer, the active layer being arranged to overlap the first gate electrode;

a source electrode and a drain electrode spaced apart from the source electrode;

a second insulating layer; and a second gate electrode, the second gate electrode and the first gate electrode being arranged on opposite sides of the active layer, wherein the second gate electrode is insulated from the active layer by the second insulating layer, wherein the active layer comprises a triple layer comprising a first crystalline oxide semiconductor layer, an amorphous oxide semiconductor layer, and a second crystalline oxide semiconductor layer, and wherein the first crystalline oxide semiconductor layer is arranged adjacent to the first insulating layer, and the second crystalline oxide semiconductor layer is arranged adjacent to the second insulating layer.

* * * * *